(12) United States Patent
Morzano et al.

(10) Patent No.: US 10,867,692 B2
(45) Date of Patent: Dec. 15, 2020

(54) APPARATUSES AND METHODS FOR LATCHING REDUNDANCY REPAIR ADDRESSES AT A MEMORY

(71) Applicant: MICRON TECHNOLOGY, INC., Boise, ID (US)

(72) Inventors: Christopher Morzano, Boise, ID (US); Sujeet Ayyapureddi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/538,572

(22) Filed: Aug. 12, 2019

(65) Prior Publication Data

US 2019/0362805 A1 Nov. 28, 2019

Related U.S. Application Data

(62) Division of application No. 15/681,183, filed on Aug. 18, 2017, now Pat. No. 10,381,103.

(51) Int. Cl.
*G11C 29/00* (2006.01)

(52) U.S. Cl.
CPC ............ *G11C 29/765* (2013.01); *G11C 29/78* (2013.01); *G11C 29/785* (2013.01); *G11C 29/72* (2013.01)

(58) Field of Classification Search
CPC ..... G11C 29/765; G11C 29/785; G11C 29/72; G11C 29/78
See application file for complete search history.

(56) References Cited

U.S. PATENT DOCUMENTS

| 5,430,679 | A | 7/1995 | Hiltebeitel et al. |
| 6,036,101 | A | 3/2000 | Bolan et al. |
| 6,211,710 | B1 | 4/2001 | Madhu et al. |
| 6,262,923 | B1 | 7/2001 | Fujita |
| 6,697,289 | B1 | 2/2004 | Yamamoto |

(Continued)

FOREIGN PATENT DOCUMENTS

| KR | 20060127014 A | 12/2006 |
| KR | 20150072576 A | 6/2015 |

(Continued)

OTHER PUBLICATIONS

International Search Report and Written Opinion dated Nov. 26, 2018 for PCT Application No. PCT/US2018/045579, 16 pages.

(Continued)

*Primary Examiner* — Mushfique Siddique
(74) *Attorney, Agent, or Firm* — Dorsey & Whitney LLP (57) ABSTRACT

Apparatuses and methods for latching redundancy repair addresses at a memory are disclosed. An example apparatus includes block of memory including primary memory and a plurality of redundant memory units and repair logic. The repair logic including a plurality of repair blocks. A repair block of the plurality of repair blocks is configured to receive a set of repair address bits associated with a memory address for defective memory of the block of memory and to latch the set of repair address bits at a respective set of latches. The repair block is further configured to, in response to receipt of a memory access request corresponding to the set of repair address bits latched at the repair block, redirecting the memory access request to a redundant memory unit associated with the repair block.

18 Claims, 6 Drawing Sheets

(56) References Cited

U.S. PATENT DOCUMENTS

| | | |
|---|---|---|
| 7,215,586 B2 | 5/2007 | Martin et al. |
| 8,462,570 B2 * | 6/2013 | Blodgett .............. G11C 29/787 |
| | | 365/201 |
| 9,666,307 B1 * | 5/2017 | Fujiwara ................ G11C 29/76 |
| 9,824,770 B1 | 11/2017 | Fujiwara et al. |
| 10,056,154 B2 | 8/2018 | Fujiwara et al. |
| 10,381,103 B2 * | 8/2019 | Morzano .............. G11C 29/785 |
| 10,443,531 B2 | 10/2019 | Morzano |
| 2002/0141264 A1 | 10/2002 | Mori et al. |
| 2002/0167855 A1 | 11/2002 | Hsu et al. |
| 2004/0004510 A1 | 1/2004 | Lehmann |
| 2004/0019763 A1 | 1/2004 | Lakhani et al. |
| 2004/0085814 A1 | 5/2004 | Kawai et al. |
| 2004/0190357 A1 | 9/2004 | Scheuerlein et al. |
| 2005/0041507 A1 | 2/2005 | Otsuka |
| 2005/0046002 A1 | 3/2005 | Lee et al. |
| 2007/0047343 A1 | 3/2007 | Adams et al. |
| 2007/0165467 A1 * | 7/2007 | Kohara ................ G11C 29/802 |
| | | 365/200 |
| 2007/0226552 A1 * | 9/2007 | Kushiyama ............ G11C 29/24 |
| | | 714/710 |
| 2007/0268760 A1 | 11/2007 | Iwai |
| 2008/0270828 A1 | 10/2008 | Wienchol |
| 2008/0284037 A1 | 11/2008 | Andry et al. |
| 2009/0204847 A1 | 8/2009 | Lakhani et al. |
| 2011/0280091 A1 | 11/2011 | Rooney et al. |
| 2013/0083612 A1 | 4/2013 | Son et al. |
| 2013/0223171 A1 | 8/2013 | Kim et al. |
| 2013/0235644 A1 | 9/2013 | Chung |
| 2013/0258748 A1 | 10/2013 | Kim et al. |
| 2013/0322183 A1 | 12/2013 | Jeong |
| 2014/0241085 A1 | 8/2014 | Ryu et al. |
| 2014/0369143 A1 * | 12/2014 | Eichmeyer ............ G11C 29/76 |
| | | 365/200 |
| 2015/0135038 A1 | 5/2015 | Wilson et al. |
| 2015/0179237 A1 | 6/2015 | Jeong |
| 2018/0075920 A1 | 3/2018 | Fujiwara et al. |
| 2019/0055895 A1 * | 2/2019 | Morzano .............. G11C 29/787 |
| 2019/0264629 A1 * | 8/2019 | Morzano .............. G11C 29/027 |

FOREIGN PATENT DOCUMENTS

| | | |
|---|---|---|
| TW | I478313 B | 3/2015 |
| TW | 201542260 A | 11/2015 |
| WO | 2018052596 A1 | 3/2018 |
| WO | 2019036229 A1 | 2/2019 |

OTHER PUBLICATIONS

U.S. Appl. No. 16/407,029, titled "Apparatuses and Methods for Storing Redundancy Repair Information for Memories" filed May 8, 2019.

English translation of KR Office Action for Application No. 10-2019-7009857, dated Feb. 10, 2020.

* cited by examiner

APPARATUSES AND METHODS FOR LATCHING REDUNDANCY REPAIR ADDRESSES AT A MEMORY

CROSS-REFERENCE TO RELATED APPLICATION(S)

This application is a divisional of U.S. patent application Ser. No. 15/681,183, filed Aug. 18, 2017 and issued as U.S. Pat. No. 10,381,103 on Aug. 13, 2019. These application and patent are incorporated by reference herein in their entirety and for any purposes.

BACKGROUND

High data reliability, high speed of memory access, lower power consumption and reduced chip size are features that are demanded from semiconductor memory. One way of achieving high data reliability is by introducing fuse arrays including a plurality of fuse sets and a plurality of redundancy decoders corresponding to the plurality of fuse sets to provide substitute rows/columns of memory cells for defective rows/columns of cells in a memory array. The addresses for defective memory of the array may be mapped to redundant memory, thereby repairing the memory location for the address. Each ruse set may store an address of a defective cell (Defective Address). Each redundant address decoder receives row/column address signals and compares the received row/column address signals to the defective addresses stored in the fuses. If the received row/column address signals correspond with a defective address stored in any fuse, access to the received row/column address is disabled and the redundant row/column address may be accessed instead. Defective addresses may be obtained by a plurality of tests that may be performed during manufacture of the semiconductor memory.

As the density of memory has increased for semiconductor memory, additional redundant memory is needed to maintain yield of fully functioning memories. The additional redundant memory requires larger fuse arrays with a greater number of fuses to store potentially more addresses. The larger the fuse array, the more area is consumed on a semiconductor die by the fuse arrays and associated programming logic, high current and high power bussing, and fuse addressing circuity. Therefore, there is a desire for reducing the size of the fuse array and the associated circuits while maintaining the repairability of larger memory density semiconductor memory.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
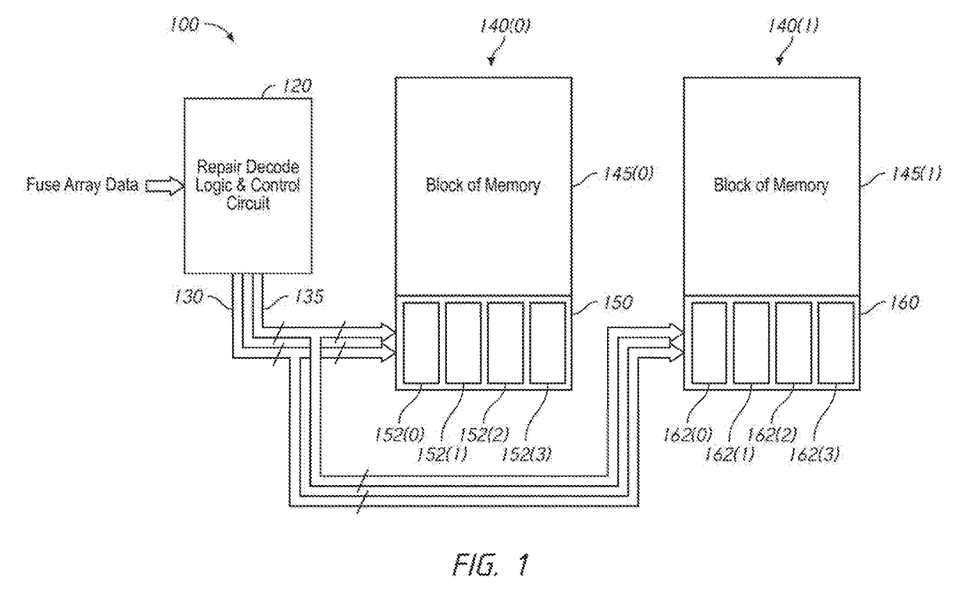
FIG. 1 is a block diagram of a memory repair system according to an embodiment of the disclosure.

FIG. 1 is a block diagram of a memory repair system 100 according to an embodiment of the disclosure. The memory repair system 100 includes a repair decode logic and control circuit 120, and repair planes 140(0)-(1). The repair plane 140(0) includes a respective block of memory 145(0) and repair logic 150. The repair plane 140(1) includes a respective block of memory 145(1) and repair logic 160. The blocks of memory 145(0)-(1) each include a plurality of rows, a plurality of columns, and a plurality of memory cells arranged at intersections of the plurality of the rows and columns.

The blocks of memory 145(0)-(1) each include primary memory and redundant memory that is limited to repairing primary memory of the associated blocks of memory 145(0)-(1). The redundant memory includes redundant memory units that may be used to repair primary memory of the same block of memory. The repair units may include redundant row units that are used to repair defective memory along the rows and may further include redundant column units that are used to repair defective memory along the columns. The repair is accomplished by remapping a memory address for a primary memory location in the block of memory to a redundant memory unit, thus repairing a defective primary memory location, as will be described in more detail below. In the embodiment of the disclosure of FIG. 1, two repair planes 140(0)-(1) are shown. However, in other embodiments, there may be more than two repair planes. Thus, the number of repair planes may be changed without departing from the scope of the present disclosure.

The repair decode logic and control circuit 120 receives fuse array data that defines the repair information and provides control signals and repair addresses to the repair logic 150 of repair plane 140(0) and/or the repair logic 160 of repair plane 140(1). In some examples, the fuse array data may be received from a fuse bank array that is on a different device than the repair decode logic and control circuit 120. In other embodiments, the fuse bank array and the repair decode logic and control circuit 120 may be included on the same device. The repair addresses are provided by the repair decode logic and control circuit 120 over repair address lines 130 and the control signals are provided by the repair decode logic and control circuit 120 over signal lines 135. The repair addresses may be loaded into repair blocks 152(0-3) of the repair logic 150 and/or repair blocks 162(0-3) of the repair logic 160. Each of the repair blocks 152(0-3) and the repair blocks 162(0-3) may be associated with a respective redundant memory unit of the respective redundant memory. The repair address loaded into a repair block of the repair blocks 152(0-3) or the repair blocks 162(0-3) will be mapped to the respective redundant memory unit so that the respective redundant memory unit is accessed instead of the primary memory associated with the repair address, thereby "repairing" the associated primary memory.

The repair logic 150 and 160 of FIG. 1 are each illustrated as including four repair blocks 152(0-3) and 162(0-3), respectively, which corresponds to repairing up to four memory addresses with four redundant memory units. It will be appreciated, however, that the number of repair blocks and corresponding redundant memory units that are included in a respective repair plane 140(0)-(1) may be greater of fewer than shown in FIG. 1 without departing from the scope of the disclosure.

As previously described, repair blocks corresponding to the redundant memory are loaded with the addresses of memory locations that are to be repaired by the redundant memory. Incoming memory addresses are compared with the addresses loaded in the repair blocks, and if the incoming address matches a loaded address, the associated redundant memory unit is accessed instead of the original primary memory location for the incoming address.

Figure 2A:
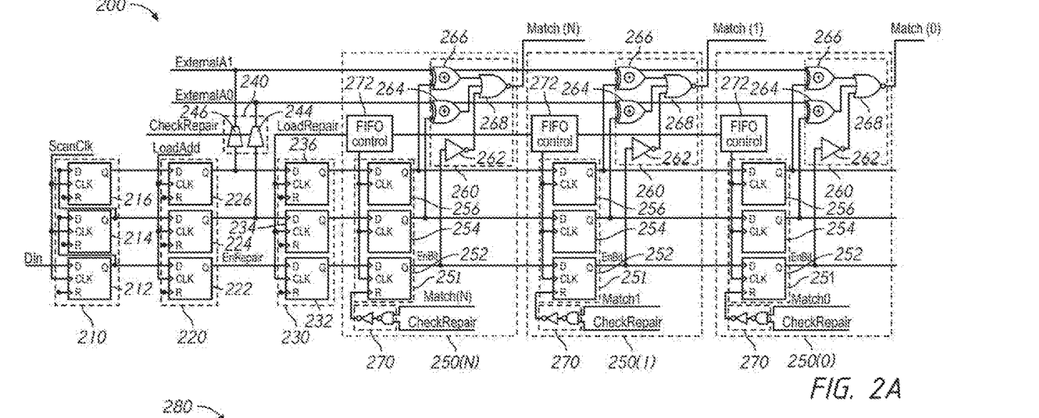
FIG. 2A is a schematic diagram of repair logic for a repair plane according to an embodiment of the disclosure.

FIG. 2A is a schematic diagram of repair logic 200 for a repair plane according to an embodiment of the disclosure. The repair logic 200 includes an input circuit 210, a preload circuit 220, and a load circuit 230. The repair logic 200 further includes a repair switch circuit 240 and repair blocks 250(0)-250(N). The repair logic 200 includes circuits for operation with two-bit repair addresses. It will be appreciated that the example of repair logic 200 for two-bit repair addresses is not intended to limit the scope of the disclosure to the specific embodiment, but is meant to provide an example that may be applied to repair addresses having a fewer or greater number of bits than described for the specific embodiment. Thus, the scope of the disclosure is not limited to the specific embodiment of the repair logic 200 of FIG. 2A.

The input circuit 210 includes FF circuits 212, 214, and 216. The FF circuits are coupled in series so that an output of the FF circuit 212 is provided to a data input of the FF circuit 214, and an output of the FF circuit 214 is provided to a data input of the FF circuit 216. The FF circuit 212 is provided repair information at a data input. As a ScanClk signal clocks, the bits of the repair information are serially shifted into and through the FF circuits 212, 214, and 216. The repair information may include information to repair one or more defective primary memory locations. In the embodiment of FIG. 2A, the information for one repair includes a two bit repair address and a one bit repair flag. In other embodiments of the disclosure, however, the number of total bits for the repair information for one defective primary memory location may be different, and the number of bits for a repair address may be different as well.

The preload circuit 220 includes FF circuits 222, 224, and 226. Each of the FF circuits 222, 224, and 226 receives at a respective data input the output of one of the FF circuits 212, 214, and 216. The FF circuits 222, 224, and 226 latch the bit applied to the respective data input responsive to a LoadAdd signal. The LoadAdd signal becomes active to cause the FF circuits 222, 224, and 226 to latch the bit after three rising edges of the ScanClk signal, in effect latching in parallel three bits that were serially shifted into the FF circuits 212, 214, and 216 of the input circuit 210.

The load circuit 230 includes FF circuits 232, 234, 236. Each of the FF circuits 232, 234, and 236 receives at a respective data input the output of one of the FF circuits 222, 224, and 226. The FF circuits 232, 234, and 236 latch the bit applied to the respective data input responsive to a LoadRepair signal. The LoadRepair signal becomes active to cause the FF circuits 232, 234, and 236 to latch the respective bit from the FF circuits 222, 224, and 226 of the preload circuit 220. After latching, the three bits are provided by the FF circuits 232, 234, and 236 to the repair block 250(N) and shifted through the repair blocks (toward the repair block 250(0)) to an available repair block.

The repair logic 200 includes repair blocks 250(0)-250(N). Each repair block 250 is associated with a respective redundant memory unit. When a valid repair address is loaded into a repair block, the address is mapped to the associated redundant memory unit. A repair block 250 includes a latch group 251 that includes FF circuits 252, 254, and 256. The latch group 251 stores a two bit repair address in FF circuits 254 and 256, and stores a one bit repair flag in FF circuit 252. The repair block 250 further includes an address comparison circuit 260. The address comparison circuit 260 compares an address received on address lines to a repair address stored by the FF circuits 254 and 256 of the latch group 251. The address comparison circuit 260 provides and active match signal Match when the received address matches the stored repair address. The address comparison circuit 260 includes EOR logic circuits 264 and 266, and a NOR logic circuit 268. The NOR logic circuit 268 receives the outputs of the OR logic circuits 264 and 266, and further receives an output of an inverter circuit 262, which receives the repair flag as the EnBit signal from the FF circuit 252.

The repair block 250 further includes a reset circuit 270 that includes a N AND logic circuit and an inverter circuit. The reset circuit 270 provides a reset signal to reset inputs of the FF circuit 252 to reset the FF circuits. The FF circuits 252 is reset when the reset signal is active. The reset signal is active when a CheckRepair signal is active (e.g., active logic high level) and there is a match between a received address and the respective repair address stored by FF circuits 254 and 256. A FIFO control circuit 272 receives the LoadRepair signal and controls the clocking of the FF circuits 252, 254, and 256 of the latch group 251. The FIFO control circuits 272 clock the FF circuits of a respective latch group 251 to shift a repair address and repair flag through the repair blocks starting from repair block 250(N) toward repair block 250(0) until the repair address and repair flag are latched by a next available repair block. In this manner, the repair addresses and repair flags are loaded into the repair blocks 250, with a first repair address and repair flag loaded into repair block 250(0), a second repair address and repair flag loaded into repair block 250(1), a third repair address and repair flag loaded info repair block 250(2), and so on.

The repair switch circuit 240 includes pass gates 244 and 246. The repair switch 240 provides repair address bits from the FF circuits 224 and 226 to respective address lines responsive to an active CheckRepair signal (e.g., active high logic level). The repair switch circuit 240 is activated to compare a repair address currently latched in the preload circuit 220 with repair addresses stored in the repair blocks 250.

The comparison of a repair address in the preload circuit 220 may be relevant when loading repair addresses of memory locations that are determined to be defective after an initial determination of defective memory locations. For example, defective memory locations may be initially determined during the manufacture of the semiconductor device. In the event a memory location is determined to be defective after the manufacture of the semiconductor device, such as when an in-field defect is determined, the address of the newly defective memory location may be loaded into a vacant repair block 250 to repair the newly defective memory location.

The comparison of a repair address for a newly defective memory location prior to being loaded from the preload circuit 220 to the load circuit 230 may be used to determine if the newly defective memory location is a memory location that has already been repaired. In such a case, one of the repair blocks 250 already loaded with the same address would indicate a match when compared with the address of the newly defective memory location. A match may indicate that the redundant memory unit used to originally repair the memory location has become defective, and as such, the now defective redundant memory unit should be skipped and repaired by another redundant memory unit, if available. The now defective redundant memory is skipped by resetting the FF circuits to zero for the latch group 251 in the repair block 250 that indicated a match. The FF circuits 252, 254,256 are reset to zero by the reset circuit 270 when the match signal and the CheckRepair signal are active.

As previously described, in some embodiments of the disclosure the number of total bits for the repair information for one defective primary memory location may be different, and the number of bits for a repair address may be different as well in comparison to the embodiment of FIG. 2A. Those of ordinary skill in the art will have sufficient understanding based on the description herein to apply the teachings to embodiments having different numbers of bits of repair information (and/or different number of bits for the repair address).

Figure 2B:
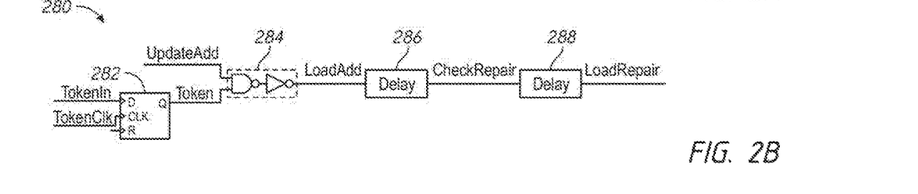
FIG. 2B is a schematic diagram of control and timing circuit according to an embodiment of the disclosur.

FIG. 2B is a schematic diagram of control and timing circuit 280 according to an embodiment of the disclosure. The control and timing circuit 280 may be used to provide the control and timing signals for the repair logic 200. The control and timing circuit 280 includes a FF circuit 282 that receives a TokenIn signal at a data input and a TokenClk signal at a clock input, and provides a Token signal to a logic circuit 284. The logic circuit 284 includes a NAND logic circuit and an inverter. The logic circuit 284 provides the TokenIn signal as the LoadAdd signal responsive 10 an active UpdateAdd signal. The LoadAdd signal is provided to a delay circuit 286, which provides a CheckRepair signal having a delay relative to the LoadAdd signal. The CheckRepair signal is provided to the delay circuit 288, which provides a LoadRepair signal having a delay relative to the CheckRepair signal. As will be described in more detail below, the LoadAdd, CheckRepair, and LoadRepair signals are provided to the repair logic 200 for operation.

Figure 4:
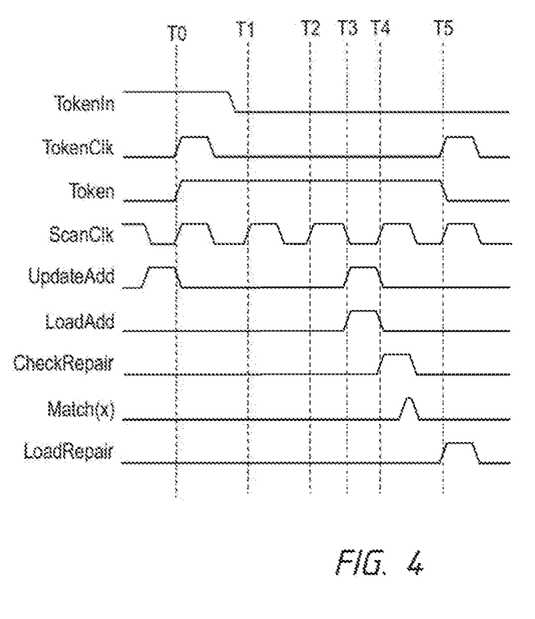
FIG. 4 is a timing diagram of various signals during operation of the repair logic and the control and timing circuit according to an embodiment of the disclosure.

Operation of the repair logic 200 and the control and timing circuit 280 will be described with reference to FIGS. 2A, 2B, and 4. FIG. 4 is a timing diagram of various signals during operation of the repair logic 200 and the control and timing circuit 280 according to an embodiment of the disclosure.

At time T0, a rising edge of the TokenClk clocks die FF circuit 282 of the control and timing circuit 280 to latch the high logic level of the TokenIn signal provided to the data input of the FF circuit 282. The FF circuit 282 provides a high logic level Token signal in response to the latching of the TokenIn signal. The TokenIn signal is at a high logic level and the TokenClk signal is active when a repair command causes the repair decode logic and control circuit to reset the repair plane token or causes a repair plane token to be transferred to a next repair plane. For example, with reference to FIG. 1, which includes two repair planes 140(0) and 140(1), each with respective repair logic 150 and 160. The logic and control circuit 120 of FIG. 1 may provide the TokenClk and TokenIn signals over the signal lines 135 to one of the repair logic blocks 150 or 160 to activate the corresponding repair logic 150 or 160 to store repair addresses in the respective repair blocks 152(0-3) or 162(0-3). Once complete, logic and control circuit 120 may clear the TokenIn signal provided the active repair logic 150 or 160, and may provide a pulse on the TokenClk signal to clear the output of the FF circuit 282, and reset or deactivate the repair logic 150 or 160. The logic and control circuit 120 may repeat the process for the other of the repair logic 150 or 160 to load repair addresses. In an example, only a signal repair logic may be active at a given time responsive to the TokenIn signal.

At times T0-T2, the rising edges of the ScanClk signal clock the FF circuits 212, 214, and 216 of the input circuit 210 to latch and shift in three bits of repair information (first string of repair address bits). The repair information may be read from a fuse array and provided to the input circuit 210 serially. The bit of repair information latched by the FF circuit 212 at lime T0 is a second bit of the repair address A1. The bit of repair information latched by the FF circuit 212 at time T1 is a first bit of the repair address A0. Also at time T1, the second bit of the repair address A1 is latched by the FF circuit 212. The bit of repair information latched by the FF circuit 212 at time T2 is the repair flag for the repair address. Also at time T2, the second bit A1 of the repair address is latched by the FF circuit 214, and the first bit A0 of the repair address bit is latched by the FF circuit 212. Thus, following time T2, three bits of repair information are latched in the input circuit 210. Thus, a serial-parallel conversion operation is performed to produce first parallel repair address bits between time T0 and T3.

At time T3, the UpdateAdd signal becomes active and is provided by the logic circuit 284 as an active LoadAdd signal, which causes the circuits 222, 224, and 226 of the preload circuit 220 to latch the three bits of repair information from the input circuit 210. The FF circuit 222 latches the repair flag, the FF circuit 224 latches the first bit of the repair address A0, and the FF circuit 226 latches the second bit of the repair address A1. Thus, following time T2, the repair flag and repair address bits A0 and A1 of the repair address are loaded in the preload circuit 220.

The active LoadAdd signal at time T3 results in an active CheckRepair signal at time T4, which is provided by the delay circuit 286. The active CheckRepair signal activates the repair switch circuit 240 to compare the repair address bits A0 and A1 latched in the preload circuit 220 with repair addresses stored in the repair blocks 250. Assuming that none of the repair blocks 250 indicate a match, the match signals all remain inactive (e.g., a low logic level) causing the reset circuit 270 to provide a low logic level signal to a reset input of the FF circuits of the latch groups 251 of the repair blocks 250. As a result, none of the FF circuits of the latch groups 251 are reset to zero. However, if one of the repair blocks 250 indicates a match, the respective match signal becomes active and causes the reset circuits 270 of the repair blocks 250 that have indicated a match to reset the FF circuits of the latch groups to zero. As a result, the redundant memory units associated with the repair blocks 250 having the FF circuits reset to zero are effectively disabled from use.

Regardless of whether die repair address in the preload circuit 220 matches a repair address stored by the latch group of a repair block 250, the repair flag and the repair address bits A0 and A1 are loaded into the load circuit 230 at time T5 by activation of the LoadRepair signal. The LoadRepair signal has a delay relative to the CheckRepair signal provided by the delay circuit 288. The active LoadRepair signal also causes the FIFO control circuit 272 of die repair blocks 250(N)-(0) to clock the FF circuits of the respective latch groups 251. The clocking of the latch groups 251 advance the repair flag and the repair address bits A0 and A1 through the repair blocks 250 towards 250(0) until the repair flag and repair address bits A0 and A1 are loaded into the latch group 251 of a next available repair block 250. After the repair block into which the repair flag and repair address bits A0 and A1 are loaded, the FIFO control circuit 272 will no longer clock the FF circuits 252, 254, and 256 of the latch group 251 to preserve the latched repair flag and repair address bits A0 and A1.

Around time T5, the TokenClk signal is activated again, which represents that the repair plane token is transferred to a next repair plane. The activated TokenClk signal causes the FF circuit 282 to latch the low logic level of the TokenIn signal. As a result, the Token signal provided by the FF circuit 282 becomes a low logic level. The low logic level of the Token signal causes the logic circuit 284 to provide a constant low logic level LoadAdd signal, thereby ceasing any further loading of new repair flags and repair addresses into the preload circuit 220. After the repair plane token is transferred to another repair plane, any unused repair blocks 250 remain unused. As shown in FIG. 4, the same operation explained above is performed on different repair information (second string of repair address bits) when this block of memory takes the repair plane token again.

As previously discussed, at time T3 the repair flag and the repair address bits A0 and A1 are loaded into the preload circuit 220 from the FF circuits 212, 214, and 216 responsive to the LoadAdd signal becoming active. The activation of the LoadAdd signal at time T3 is approximately concurrent with a falling edge of the ScanClk signal. In an example where the repair plane token is not transferred to another repair plane by the activation of the TokenClk at time T5, as the ScanClk signal continues to clock following time T3, bits of a next repair flag and repair address are latched and shifted into the FF circuits 212, 214, and 216 of the input circuit 210. The next repair flag and repair address are then loaded into the FF circuits 222, 224, and 226 of the preload circuit 220 responsive to a next active LoadAdd signal, the repair flag and repair address are then loaded into a next available repair block of the repair blocks 250(0)-(N) through the load circuit 230. More generally, the latching and shifting of bits of new repair flags and repair addresses into the input circuit 210 to then be loaded into the repair blocks 250(0)-(N) through the preload circuit 220 and load circuit 230 continues until the repair plane token is transferred to another repair plane, for example, responsive to a repair command.

Figure 3:
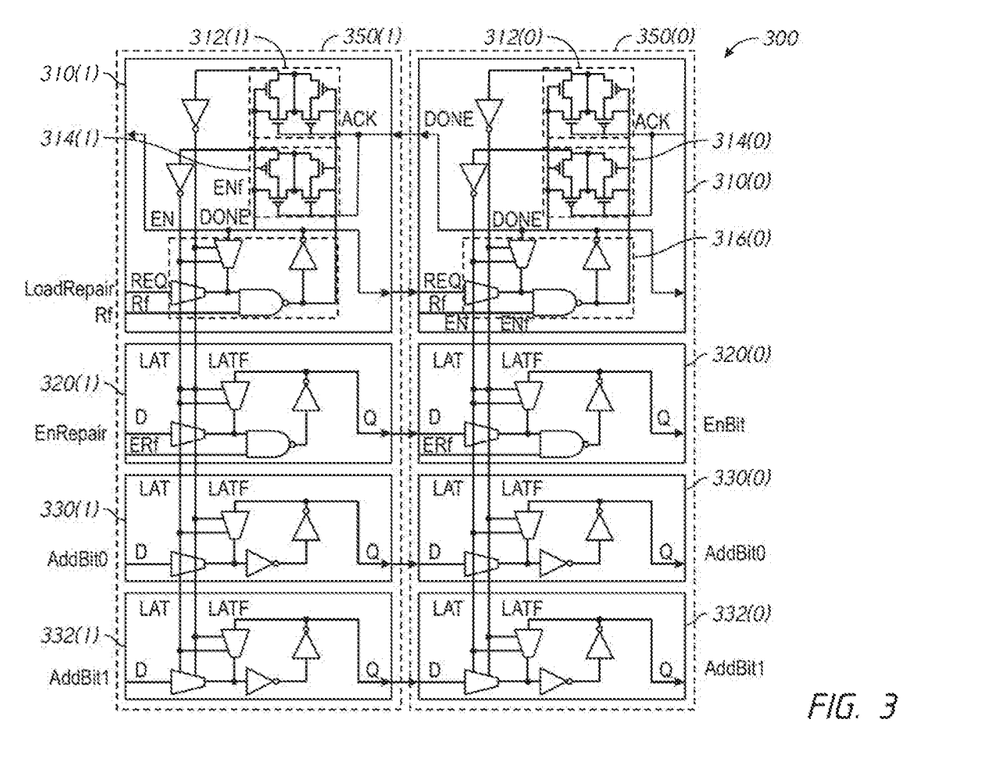
FIG. 3 is a schematic diagram of a repair block for repair logic according to an embodiment of the disclosure.

FIG. 3 is a schematic diagram of two repair blocks 350(0)-(1) implemented in repair logic 300 according to an embodiment of the disclosure. The repair blocks 350(0)-(1) may be implemented in two sequential repair blocks of the repair blocks 250(0)-(N) of FIG. 2A.

Each of the repair blocks 350(0)-(1) may include a respective control circuit 310(0)-(1), a respective enable bit latch circuits 320(0)-(1), a respective address latch circuit 330(0)-(1), and a respective address latch circuit 332(0)-(1). The respective control circuits 310(0)-(1) may each include latch controller circuits 312(0)-(1) and 314(0)-(1) and latch circuits 316(0)-(1). The latch controller circuits 312(0)-(1) and 314(0)-(1) may operate as individual XNOR logic gates. The respective control circuits 310(0)-(1) communicated with each other using request signals REQs and acknowledgement signals ACKs. The latch circuits 316(0)-(1) are controlled by die enable EN and EN complement ENf signals. Initially, the latch circuits 316(0)-(1) may allow new data via the respective REQ signals to pass through to the next control circuit until the data reaches the last unused repair block 350(0)-(1). The latch circuits 316(0)-(1) may be configured to receive respective reset signals Rf. The Rf signal may be an active low signal.

The EN and ENf signals may be passed through to the respective enable bit latch circuits 320(0)-(1), the respective address latch circuits 330(0)-(1), and the respective address latch circuits 332(0)-(1) as latch LAT and LAT complement LATf signals.

The respective enable bit latch circuits 320(0)-(1) may operate similar to the latch circuits 316(0)-(1), being controlled by the LAT and LATf signals. The enable bit latch circuits 320(0)-(1) may also be reset via respective enable bit reset signals ERf. The ERf signals may be provided by a reset circuit, such as the reset circuit 270 of FIG. 2A. The respective address latch circuits 330(0)-(1) and the respective address latch circuits 332(0)-(1) may also operate similar to the latch circuits 316(0)-(1), being controlled by the LAT and LATf signals, but without capability to receive a respective reset signal. In some examples, the respective enable bit latch circuits 320(0)-(1), the respective address latch circuits 330(0)-(1), and the respective address latch circuits 332(0)-(1) may be implemented in the FF circuits 252, 254, and 256, respectively, of FIG. 2A.

In operation, the sequential repair blocks 350(0)-(1) may operate like a pipeline in passing the EnRepair signal and address bits AddBit0 and AddBit1 to a last unused block. Initially, when the pipeline is empty, the latch circuits 316(0)-(1), the enable bit latch circuits 320(0)-(1), the address latch circuits 330(0)-(1), and the address latch circuits 332(0)-(1) are enabled to pass data through to a respective subsequent latch circuit. Additionally, the DONE, REQ, and ACK signals may all be set low. When a first set of the EnRepair, AddBit0, and AddBit1 data items flow through successive repair blocks 350(0)-(1) of the pipeline, the values of each of the REQ, ACK, and DONE signals of the control circuits 310(0)-(1) may transition high. Subsequently, When a second set of the EnRepair, AddBit0, and AddBit1 data items flow through successive repair blocks 350(0)-(1) of die pipeline, the values of each of the REQ, ACK, and DONE signals in the control circuits 310(0)-(1) may transition low. Each of these transitions of die REQ, ACK, and DONE signals, whether high or low, represents a distinct event: arrival of new EnRepair, AddBit0, and AddBit1 data items.

In response to receipt of a set of the EnRepair, AddBit0, and AddBit1 data items and the REQ signal at a current repair block, three actions may take place in parallel. First, the set of EnRepair, AddBit0, and AddBit1 data items may be passed forward to the next repair block, along with a value of the DONE signal to the next repair block (e.g., received as the REQ signal at the next repair block). Second, the value of the DONE signal to the previous repair block (e.g., received as the ACK signal at the previous repair block). Receiving the ACK signal at the previous repair block may enable the previous repair block to process a next set of the EnRepair, AddBit0, and AddBit1 data items. Third, a the current repair block may be disabled to protect the received set of EnRepair, AddBit0, and AddBit1 data items from being overwritten by a new set of EnRepair, AddBit0, and AddBit1 data items.

At the current repair block, in response to receipt of the ACK signal from a subsequent repair block, the respective latch circuit 316(0)-(1), the respective enable bit latch circuit 320(0)-(1), the respective address latch circuit 330(0)-(1), and the respective address latch circuit 332(0)-(1) may be enabled again to pass die set of EnRepair, AddBit0, and AddBit1 data items through to a next repair block. While signal transition signaling may be used to signal the flow of the set of EnRepair, AddBit0, and AddBit1 data items (e.g., one transition on each REQ, ACK, and DONE signals per data set), the latch circuits (e.g., the latch circuits 316(0)-(1), the enable bit latch circuits 320(0)-(1), the address latch circuits 330(0)-(1), and the address latch circuits 332(0)-(1)) may require two transitions per data item: one to capture the data item (e.g., by disabling the latch circuit), and one to release (e.g., by enabling the latch circuit). The respective Q signals of the latch circuits 320(0)-(1), 330(0)-(1), 332(0)-(1) may be the respective latched data item. The first transition may take place when the data set passes through a current repair block latch circuits (e.g., the DONE signal changes value). The second transition may occur when the same data set passes through the subsequent repair block latch circuits (e.g., the ACK signal changes value). To control this operation, the latch controller circuits 312(0)-(1) and 314(0)-(1) may serve as equality comparators. That is, when two consecutive repair blocks have the same set of data items, the earlier of the two repair blocks is effectively "empty," and its latch circuits are enabled to pass through a set of data items. When two consecutive repair blocks have a different set of data items, the previous stage is effectively "full," and its latch circuits are disabled to prevent from passing through a set of data items.

Therefore, upon receipt, the repair block 350(1) passes a first set of EnRepair, AddBit0, and AddBit1 data items through to the repair block 350(0) via the latch circuits 320(1), 330(1), and 332(1), respectively, and upon receipt, the repair block 350(0) sends the ACK signal to the repair block 350(0). In response to receipt of the ACK signal, the latch circuits 320(1), 330(1), and 332(1) of the repair block 350(1) may be enabled to receive and pass through a second set of the EnRepair, AddBit0, and AddBit1 data items. Because the repair block 350(0) is the last repair block in the repair block sequence, it will not receive a transition on its ACK signal, which may prevent it from passing the second set of the EnRepair, AddBit0, and AddBit1 data items through to outputs of its the latch circuits 320(0), 330(0), and 332(0). Thus, the latch circuits 320(0), 330(0), and 332(0) of the repair block 350(0) may hold values associated with the first set of EnRepair, AddBit0, and AddBit1 data items. Because the repair block 350(1) will not receive a second ACK signal transition from the repair block 350(0) corresponding to receipt of the second set of the EnRepair, AddBit0, and AddBit1 data items, the latch circuits 320(1), 330(1), and 332(1) of the repair block 350(1) may prevent pass through of any subsequent set of the EnRepair, AddBit0, and AddBit1 data items. For a given repair block of the repair blocks 350(0)-(1), an address comparison circuit, such as the address comparison circuit 260 of FIG. 2A, may use values of the Q signals provided at an output of the latch circuits 320(0), 330(0), and 332(0) to perform a repair address comparison.

The repair lock 300 of FIG. 3 depicts two of the repair blocks 350(0)-(1). It will be appreciated that more than two repair blocks may be added to the sequence. Further, each of the repair blocks 350(0)-(1) depict two address bit latch circuits 330(0)-(1) and 332(0)-(1). It will be appreciated that each of the each of the repair blocks 350(0)-(1) may include more than two address latch circuits.

Figure 5:
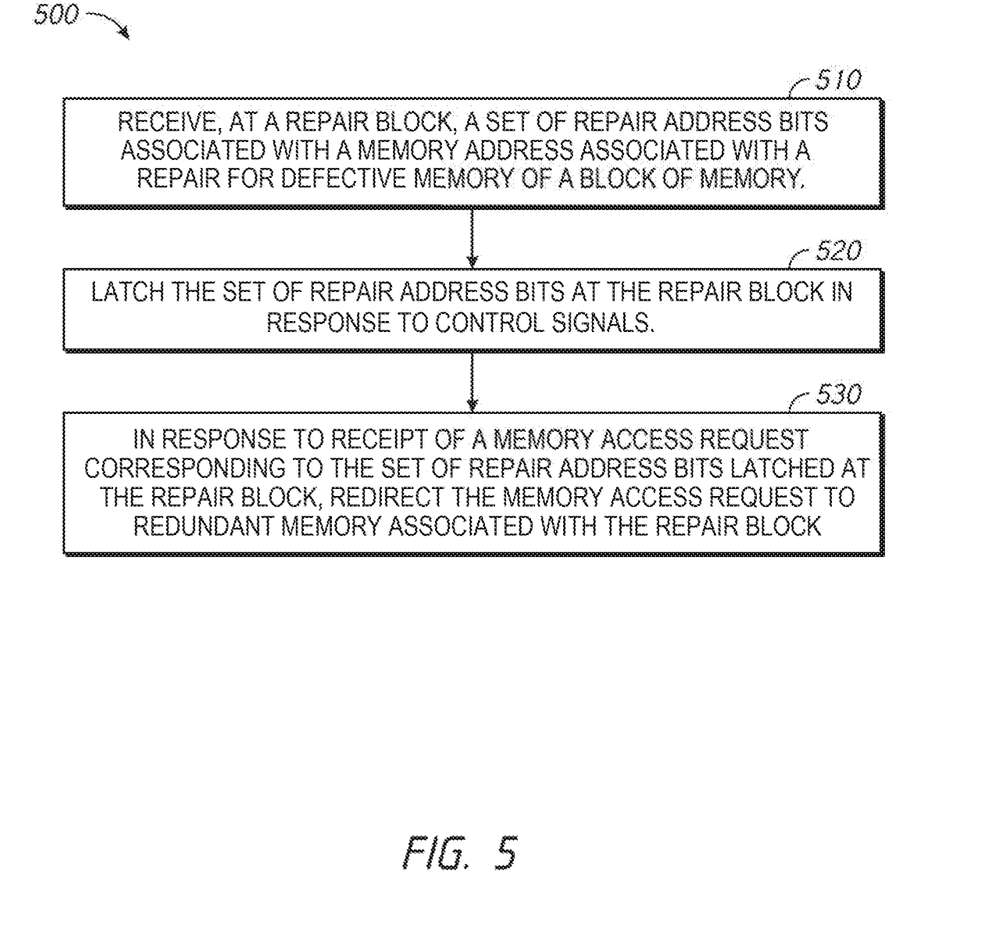
FIG. 5 is a flow chart for a method to latch a repair address according to an embodiment of the disclosure.

FIG. 5 is a flowchart of a method 500 to latch a repair address in accordance with examples described herein. Example method 500 may be implemented using, for example, any of repair logic 152(0)-(3) of FIG. 1, repair logic 200 of FIG. 2, or repair logic 300 of FIG. 3. The operations described in blocks 510-530 may also be stored as computer-executable instructions in a computer-readable medium.

The method 500 may include receiving, at a repair block of repair logic, a set of repair address bits associated with a memory address associated with a repair, at 510. The set of repair address bits may be provided by a fuse array. The repair logic may include any of repair logic 152(0)-(3) of FIG. 1, repair logic 200 of FIG. 2A, or repair logic 300 of FIG. 3. The repair block may include any of repair blocks 250(0)-(N) or repair blocks 350(0)-(1). The method 500 may further include propagating the pair of repair address bits through a previous repair block of the repair logic to the repair block. The repair blocks may be coupled in a pipeline as depicted in FIGS. 2A and 3, for example.

The method 500 may further include latching the set of repair address bits at the repair block in response to control signals, at 520. The signals may be latched at an address latch, such as the FFs 254 or 256 or the address latches 330(0)-(1) or 332(0)-(1). The method 500 may further include, in response to latching the set of repair address bits, preventing the set of address bits from being overwritten. The method 500 may further include invalidating the latched set of repair address bits at the repair block in response to receipt of a second set of repair address bits that are identical to the set of repair address bits. The invalidation may be implemented via an enable bit latch (e.g., such as the FF 252 of FIG. 2A or one of the enable bit latches 320(0)-(1) of FIG. 3, a repair switch circuit (e.g., such as the switch circuit 240 of FIG. 2A), an address comparison circuit (e.g., such as the address comparison circuit 260 of FIG. 2A) and a reset circuit (e.g., such as the reset circuit 270 of FIG. 2A).

The method 500 may further include in response to receipt of a memory access request corresponding to the set of repair address bits latched at the repair block, redirecting the memory access request to a repair address associated with the repair block. The repair block may be included in a block of memory, such as the block of memory 145 of FIG. 1.

Figure 6:
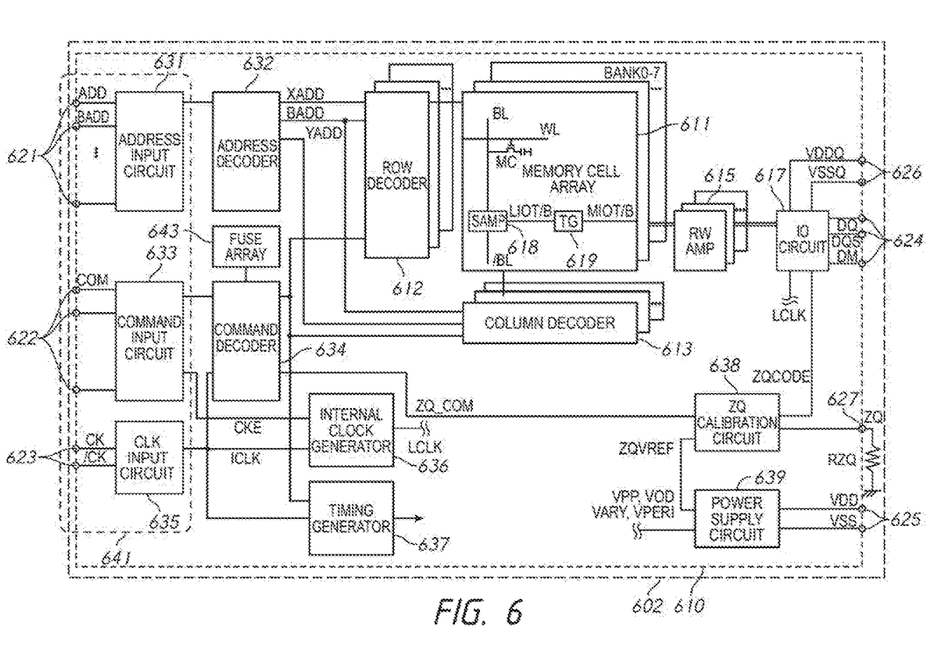
FIG. 6 is a block diagram of a semiconductor device according to an embodiment of the disclosure.

FIG. 6 is a block diagram of a semiconductor device in accordance with an embodiment of the present disclosure. The semiconductor device 610 may include a memory repair system according to an embodiment of the disclosure. For example, in an embodiment of the disclosure, the semiconductor device 610 includes a memory repair system 100 of FIG. 1A.

The semiconductor device 610 may be a memory device integrated into a single semiconductor chip, for example. The semiconductor device 610 may be mounted on an external substrate 602 that is a memory module substrate, a mother board or the like. The semiconductor device 610 may include various circuits, including memory circuits, as will be described in more detail below. As shown in FIG. 6, the semiconductor device 610 includes a memory cell array 611. The memory cell array 611 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 612 and the selection of the bit line BL is performed by a column decoder 612. Sense amplifiers 618 are coupled to corresponding bit lines BL and connected to local I/O line pairs LIOT/B. Local IO line pairs LIOT/B are connected to main IO line pairs MIOT/B via transfer gates TG 619 which function as switches. The memory cell array 611 includes repair planes according to an embodiment of the disclosure. Defective memory of the memory cell array 611 may be repaired using the repair planes.

Turning to the explanation of a plurality of external terminals included in the semiconductor device 610, the plurality of external terminals includes address terminals 621, command terminals 622, clock terminals 623, data terminals 624, power supply terminals 625 and 626, and the calibration terminal ZQ 627. An input signal block 641 may include the address terminals 621, the command terminals 622 and the clock terminals 623. A data interface block 642 includes the data terminals 624. The data terminals 624 may be coupled to output butters for read operations of memories. Alternatively, the data terminals 624 may be coupled to input buffers for read/write access of the memories that will be later described. FIG. 6 shows an example of dynamic random access memory (DRAM); however, any device having external terminals for signal input/output may be included as the external terminals of embodiments of the present disclosure.

The address terminals 621 are supplied with an address signal ADD and a bank address signal BADD. The address signal ADD and the bank address signal BADD supplied to the address terminals 621 are transferred via an address input circuit 631 to an address decoder 632. The address decoder 632 receives the address signal ADD and supplies a decoded row address signal XADD to the row decoder 612, and a decoded column address signal YADD to the column decoder 613. The address decoder 632 also receives the bank address signal BADD and supplies the bank address signal BADD to the row decoder 612 and the column decoder 613.

The command terminals 622 are supplied with a command signal COM. The command signal COM may include one or more separate signals. The command signal COM input to the command terminals 621 is input to a command decoder 634 via the command input circuit 633. The command decoder 634 decodes the command signal COM to generate various internal command signals. For example, the internal commands may include a row command signal to select a word line and a column command signal, such as a read command or a write command, to select a bit line, and a calibration signal ZQ_COM provided to the ZQ calibration circuit 638.

Accordingly, when a read command is issued and a row address and a column address are timely supplied with the read command, read data is read from a memory cell MC in the memory cell array 611 designated by these row address and column address. The read data DQ is output externally from the data terminals 624 via a read write amplifier 615 and an input/output circuit 617. Similarly, when the write command is issued and a row address and a column address are timely supplied with the write command, and then write data DQ is supplied to the data terminals 624, the write data DQ is supplied via the input/output circuit 617 and the read/write amplifier 615 to the memory cell array 611 and written in the memory cell MC designated by the row address and the column address. The input/output circuit 617 may include input buffers, according to one embodiment.

The clock terminals 623 are supplied with external clock signals CK and /CK, respectively. These external clock signals CK and /CK are complementary to each other and are supplied to a clock input circuit 635. The clock input circuit 635 receives the external clock signals CK and /CK and generates an internal clock signal ICLK. The internal clock signal ICLK is supplied to an internal clock generator 636 and thus a phase controlled internal clock signal LCLK is generated based on the received internal clock signal ICLK and a clock enable signal CKE from the command input circuit 633. Although not limited thereto, a DLL circuit can be used as the internal clock generator 636. The phase controlled internal clock signal LCLK is supplied to the input/output circuit 617 and is used as a timing signal for determining an output timing of the read data DQ. The internal clock signal ICLK is also supplied to a timing generator 637 and thus various internal clock signals can be generated.

The semiconductor device 610 further includes a fuse array 643 including a plurality of fuse elements) that may be programmed with repair information as previously described. The command decoder 634 may include a repair decode logic and control circuit according to an embodiment of the disclosure to read the repair information from the fuse array 643 and load repair addresses into repair blocks to repair defective memory locations of the memory cell array 611.

The power supply terminals 625 are supplied with power supply voltages VDD and VSS. These power supply voltages VDD and VSS are supplied to an internal power supply circuit 639. The internal power supply circuit 639 generates various internal voltages VPP, VOD, VARY, VPERI, and the like and a reference voltage ZQVREF based on the power supply voltages VDD and VSS. The internal voltage VPP is mainly used in the row decoder 612, the internal voltages VOD and VARY are mainly used in the sense amplifiers 18 included in the memory cell array 611, and the internal voltage VPERI is used in many other circuit blocks. The reference voltage ZQVREF is used in the ZQ calibration circuit 638.

The power supply terminals 626 are supplied with power supply voltages VDDQ and VSSQ. These power supply voltages VDDQ and VSSQ are supplied to the input-output circuit 617. The power supply voltages VDDQ and VSSQ may be the same voltages as the power supply voltages VDD and VSS that are supplied to the power supply terminals 625, respectively. However, the dedicated power supply voltages VDDQ and VSSQ may be used for the input-output circuit 617 so that power supply noise generated by the input-output circuit 617 does not propagate to the other circuit blocks.

The calibration terminal ZQ is connected to the calibration circuit 638. The calibration circuit 638 performs a calibration operation with reference to an impedance of an external resistor RZQ and the reference voltage ZQVREF, when activated by the calibration signal ZQ_COM. The external resistor RZQ that is connected to a calibration terminal ZQ 27 of the semiconductor device 10. The external resistor RZQ is a reference impedance of a ZQ calibration circuit 63S. In the present embodiment, the external resistor RZQ is coupled to ground. An impedance code ZQCODE obtained by the calibration operation is supplied to the input/output circuit 617, and thus an impedance of an output buffer (not shown) included in the input/output circuit 617 is specified.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising:
   receiving, at a repair block, a set of repair address bits associated with a memory address associated with a repair for defective memory of a block of memory;
   latching the set of repair address bits at the repair block in response to control signals;
   in response to receipt of a memory access request corresponding to the set of repair address bits latched at the repair block, redirecting the memory access request to redundant memory associated with the repair block; and
   in response to receipt of another set of repair address bits that are identical to the set of repair address bits, invalidating the latched set of repair address bits at the repair block.

2. The method of claim 1, further comprising propagating the set of repair address bits through a previous repair block to the repair block.

3. The method of claim 1, further comprising, in response to latching the set of repair address bits, preventing the set of repair address bits from being overwritten.

4. The method of claim 1, further comprising comparing the another set of repair address bits with the set of repair address bits to generate a match signal when the another set of repair address bits are identical to the set of repair address bits, wherein invalidating the latched set of repair address bits at the repair block comprises resetting the latched set of repair address bits to zero responsive at least to the match signal.

5. The method of claim 1, further comprising receiving the set of repair address bits from a fuse array.

6. A method of operating a load circuit, a first latch group and a second latch group, comprising:
   receiving a first string of repair address bits;
   performing a first serial-parallel conversion operation to produce first parallel repair address bits responsive to the first string of repair address bits;
   loading the first parallel repair address bits into the load circuit responsive to a first timing pulse;
   transferring the first parallel repair address bits from the load circuit to the first latch group responsive to a second timing pulse;
   receiving a second string of repair address bits;
   performing a second serial-parallel conversion operation to produce second parallel repair address bits responsive to the second string of repair address bits;
   loading the second parallel repair address bits into the load circuit responsive to a third timing pulse; and
   responsive to a fourth timing pulse, transferring the first parallel repair address bits from the first latch group to the second latch group and the second parallel repair address bits from the load circuit to the first latch group.

7. The method of claim 6, further comprising:
   comparing the second parallel repair address bits to the first parallel repair address bits stored in the first latch group before loading the second parallel repair address bits into the load circuit;
   wherein transferring the first parallel repair address bits from the first latch group to the second latch group is performed when it is detected that the second parallel repair address bits do not match the first parallel repair address bits as a result of the comparing.

8. The method of claim 7, further comprising deleting the first parallel repair address bits stored in the first latch group before receiving the fourth timing pulse when it's detected that the second parallel repair address bits match the first parallel repair address bits as the result of the comparing.

9. The method of claim 6, further comprising receiving a clock signal, wherein each of the first, second, third and fourth timing pulses is produced based on the clock signal.

10. The method of claim 9, wherein the first serial-parallel operation is performed responsive to a first portion of the clock signal containing multiple cycles of the clock signal, the second serial-parallel operation is performed responsive to a second portion of the clock signal containing multiple cycles of the clock signal and the first portion does not overlap the second portion.

11. A method comprising:
    latching, at a first repair block, a set of repair address bits associated with a memory address associated with a repair for defective memory of a block of memory;
    responsive to an acknowledgement signal received at the first repair block from a second repair block, propagating the latched set of repair address bits to the second repair block; and
    responsive to receiving an active acknowledgment signal at the first repair block from the second repair block, latching the propagated set of repair address bits at the second repair block.

12. The method of claim 11, wherein the first repair block and the second repair block are consecutive repair blocks in a pipeline.

13. The method of claim 11 further providing the acknowledgement signal at the second repair block by comparing the set of repair address bits latched at the first repair block to the set of repair address bits latched at the second repair block.

14. The method of claim 13, wherein:
    the acknowledgement signal is active when the set of repair address bits in the first repair block are the same as the set of repair address bits in the second repair block; and
    the acknowledgement signal is inactive when the set of repair address bits in the first repair block are different from the set of repair address bits in the second repair block.

15. The method of claim 13 further comprising:
    propagating the latched set of repair address bits in the second repair block to a third repair block subsequent to the second repair block responsive to an additional acknowledgement signal from the third repair block.

16. A method comprising:
    enabling one or more repair blocks in a pipeline of repair blocks; and
    responsive to receiving a control signal from a preceding repair block in the pipeline of repair blocks, passing a set of repair address bits through the one or more enabled repair blocks in the pipeline of repair blocks until a disabled repair block in the pipeline of repair blocks,
    wherein the control signal is provided by comparing repair address bits in the enabled repair block with repair address bits in the preceding repair block in the pipeline of repair blocks.

17. A method of comprising:
    enabling one or more repair blocks in the pipeline of repair blocks based on a control signal received from a subsequent repair block in the pipeline of repair blocks; and passing a set of repair address bits through the one or more enabled repair blocks in the pipeline of repair blocks until a disabled repair block in the pipeline of repair blocks.

18. The method of claim 17 further comprising providing the control signal at the subsequent repair block by:
- comparing repair address bits in the repair block with repair address bits in a subsequent repair block in the pipeline of repair blocks;
- providing an active control signal if the repair address bits in the repair block and the repair address bits in the subsequent repair block are same; and
- providing an inactive control signal if any bit of the repair address bits in the repair block and a corresponding bit of the repair address bits in the subsequent repair block are different.

* * * * *